(12) United States Patent
Cordoba Galera

(10) Patent No.: US 11,367,336 B2
(45) Date of Patent: Jun. 21, 2022

(54) SHORT-CIRCUIT ISOLATOR

(71) Applicant: Carrier Corporation, Palm Beach Gardens, FL (US)

(72) Inventor: Andres Cordoba Galera, Barcelona (ES)

(73) Assignee: CARRIER CORPORATION, Palm Beach Gardens, FL (US)

( * ) Notice: Subject to any disclaimer, the term of this patent is extended or adjusted under 35 U.S.C. 154(b) by 0 days.

(21) Appl. No.: 17/095,196

(22) Filed: Nov. 11, 2020

(65) Prior Publication Data

US 2021/0142649 A1   May 13, 2021

(30) Foreign Application Priority Data

Nov. 13, 2019 (EP) .................................... 19382992

(51) Int. Cl.
| | |
|---|---|
| G08B 21/18 | (2006.01) |
| H04B 17/27 | (2015.01) |
| G01R 31/52 | (2020.01) |
| A62C 37/50 | (2006.01) |
| G08B 17/00 | (2006.01) |
| H02H 3/04 | (2006.01) |
| H02H 3/08 | (2006.01) |

(52) U.S. Cl.
CPC ............ *G08B 21/185* (2013.01); *A62C 37/50* (2013.01); *G01R 31/52* (2020.01); *G08B 17/00* (2013.01); *H02H 3/04* (2013.01); *H02H 3/08* (2013.01); *H04B 17/27* (2015.01)

(58) Field of Classification Search
CPC ...... G08B 21/185; G08B 17/00; H04B 17/27; G01R 31/52; A62C 37/50; H02H 3/04; H02H 3/08
See application file for complete search history.

(56) References Cited

U.S. PATENT DOCUMENTS

| | | | |
|---|---|---|---|
| 5,097,259 A | 3/1992 | Testa et al. | |
| 5,754,103 A | 5/1998 | Kanai et al. | |
| 9,965,944 B1* | 5/2018 | Zwirn | ................. G06F 13/4282 |
| 2014/0233141 A1* | 8/2014 | Blemel | .................... H02H 7/20 361/78 |
| 2015/0067378 A1* | 3/2015 | Kobayashi | ............. G01R 31/52 713/340 |

(Continued)

FOREIGN PATENT DOCUMENTS

| | | |
|---|---|---|
| CN | 204031187 U | 12/2014 |
| CN | 204031188 U | 12/2014 |

(Continued)

OTHER PUBLICATIONS

European Search Report for application EP 19382992.6, dated Mar. 27, 2020, 7 pages.

*Primary Examiner* — Julie B Lieu
(74) *Attorney, Agent, or Firm* — Cantor Colburn LLP

(57) ABSTRACT

A short-circuit isolator for electrically isolating a short circuit in a fire protection system includes a wireless communication module. The wireless communication module may transmit a status of short-circuit isolator and/or additional data that can be detected by a tool carried by an operator. The wireless communication module may additionally allow the operator to locate the short-circuit isolator, based on an intensity of a wireless signal from the wireless communication module.

15 Claims, 2 Drawing Sheets

(56) References Cited

U.S. PATENT DOCUMENTS

| | | | | |
|---|---|---|---|---|
| 2015/0131188 A1* | 5/2015 | Yao | ............................ | H03F 1/52 |
| | | | | 361/87 |
| 2015/0364038 A1* | 12/2015 | Meah | ..................... | G08B 29/06 |
| | | | | 398/111 |
| 2016/0225562 A1* | 8/2016 | Franks | ...................... | H02H 3/08 |
| 2019/0178919 A1 | 6/2019 | Magno | | |
| 2020/0342745 A1* | 10/2020 | Oliver | .................... | G08B 25/10 |
| 2020/0366079 A1* | 11/2020 | Telefus | ................ | H01H 33/593 |
| 2021/0312786 A1* | 10/2021 | Pulluru | ................ | H04B 17/318 |

FOREIGN PATENT DOCUMENTS

| | | |
|---|---|---|
| CN | 107633640 A | 1/2018 |
| CN | 107886673 A | 4/2018 |
| CN | 207718600 U | 8/2018 |
| DE | 102017108822 A1 | 10/2018 |
| EP | 0101172 B1 | 3/1987 |
| GB | 2451059 A | 1/2009 |

\* cited by examiner

SHORT-CIRCUIT ISOLATOR

FOREIGN PRIORITY

This application claims priority to European Patent Application No. 19382992.6, filed Nov. 13, 2019, and all the benefits accruing therefrom under 35 U.S.C. § 119, the contents of which in its entirety are herein incorporated by reference.

TECHNICAL FIELD OF INVENTION

The present disclosure relates to a short-circuit isolator for use in a fire protection system.

BACKGROUND OF THE INVENTION

Fire protection systems typically comprise a large number of electrical components, including fire detectors (such as smoke and heat sensors), manual call points, fire alarms, and fire suppression systems (such as sprinklers, fire barriers, smoke extractors, etc.). These are typically electrically connected in a loop configuration, with the connecting wiring starting and finishing at a fire control panel. In some instances, multiple loops may be connected to a single fire control panel, and a loop may sometimes comprise one or more short spurs.

A loop configuration typically comprises a plurality of short-circuit isolators, which divide the loop into multiple, electrically isolatable segments. If a short circuit occurs, for example due to an electrical fault, then the short-circuit isolator on either side of the short circuit will activate and electrically isolate the segment containing the short circuit. The segments on either side of the isolated segment will continue to receive power because the wiring is configured as a loop, thereby preventing a single electrical fault disabling a large number of the components in the fire protection system. Typically, each isolatable segment will contain no more than 32 components.

Short-circuit isolators are often self-contained units, which do not communicate with the fire control panel. For example, short-circuit isolators will often have a local, status indicator, such as an LED, to indicate whether or not the isolator has been activated. However, short-circuit isolators are also typically placed in locations that are out-of-sight, such as behind walls, in floor cavities and above false ceilings. This can make identification and rectification of a short circuit difficult.

A fire control panel may be able to identify that a short-circuit isolator has been activated because a number of components within the fire protection system will become unresponsive. However, the precise physical locations of these components may not be readily known (for example, the fire control panel will often only know a general location of the components, such as the floor of the building where the components are located). Furthermore, even once the disabled components have been located, the associated short-circuit isolator may be located some distance away from those components.

A need therefore exists for improved short-circuit isolation within a fire protection system.

SUMMARY OF THE INVENTION

The present invention provides a short-circuit isolator for electrically isolating a short circuit in a fire protection system, the short-circuit isolator comprising a wireless communications module.

The use of a wireless communication advantageously simplifies communication and control of the short-circuit isolator. Furthermore, the use of wireless communication may facilitate location of the short-circuit isolator by monitoring the intensity of a wireless communication signal transmitted by the wireless communication module as a detector is moved with respect to the short-circuit isolator.

The wireless communications module may be configured to indicate a status of the short-circuit isolator. The status may comprise an interrupted status or a not-interrupted status. The status may be indicative of whether the short-circuit isolator has been activated, i.e. whether the short circuit isolator is electrically isolating a segment of an electrical circuit.

The wireless communications module may be configured to receive a command. The short-circuit isolator may be configured to operate in accordance with the command received via the wireless communications module. The command may comprise any one or more of: a command to test a line resistance at the short-circuit isolator; a command to wirelessly transmit data from the short-circuit isolator; a command to activate the short-circuit isolator, i.e. a command to electrically isolate two wiring segments adjacent the short-circuit isolator; and a command to deactivate the short-circuit isolator, i.e. a command to electrically connect two wiring segments adjacent the short-circuit isolator.

The short-circuit isolator may comprise a memory. The memory may be suitable for storing data relating to operation of the short-circuit isolator and/or data relating to health of the fire protection system at the short-circuit isolator. The short-circuit isolator may be configured to store data relating to operation of the short-circuit isolator in the memory.

The short-circuit isolator may be configured to transmit at least part of the data from the memory via the wireless communications module. The part of the data transmitted via the wireless communications module may comprise one or more of: data relating to the operation of the short-circuit isolator during a period prior to activation of the short-circuit isolator and/or data relating to the operation of the short-circuit isolator after activation of the short-circuit isolator and/or data relating to heath of the fire protection system at the short-circuit isolator.

The short-circuit isolator may be configured to detect a short circuit. The short circuit may be detected monitoring a line resistance associated within a circuit associated with the short-circuit isolator. A short circuit may be detected by detection of a reduction in the line resistance below a threshold value.

The short-circuit isolator is configured to interrupt an electrical circuit associated with the short-circuit isolator, preferably responsive to detection of a short circuit.

The short-circuit isolator may comprise a first electrical terminal and a second electrical terminal. The first and second electrical terminals may be configured for connection to first and second segments of a circuit. The first electrical terminal may be configured for connection to a neutral conductor of the first segment, and the second electrical terminal may be configured for connection a neutral conductor of the second segment. The short-circuit isolator may be configured to selectively electrically isolate and electrically connect the first electrical terminal and the second electrical terminal.

In one embodiment, there is a further provided a fire protection system comprising: a fire control panel; and a plurality of components electrically connected to the fire control panel in a loop configuration; wherein the loop configuration is divided into segments using one or more short-circuit isolators as described above.

The components may comprise one or more of a heat detector, a smoke detector, a fire alarm, and a manual call point.

In a further embodiment, there is yet further provided a building comprising the fire protection system described above. The building may be a residential building, a commercial building or an industrial building. The building may be a multi-storey building.

Viewed from a second aspect, the present invention provides a method of interacting with a short-circuit isolator, the method comprising wireless receiving data from the short-circuit isolator and/or wireless transmitting a command to the short-circuit isolator.

The data may comprise a status indicative of whether the short-circuit isolator has been activated.

The data comprise data relating to the operation of the short-circuit isolator during a period prior to activation of the short-circuit isolator and/or data relating to the operation of the short-circuit isolator after activation of the short-circuit isolator and/or data relating to heath of the fire protection system at the short-circuit isolator.

The command may comprise any one or more of: a command to test a line resistance at the short-circuit isolator; a command to wirelessly transmit data from the short-circuit isolator; a command to electrically connect two wiring segments adjacent the short-circuit isolator; and a command to electrically isolate two wiring segments adjacent the short-circuit isolator.

The short-circuit isolator may be as described above, optionally including any one or more or all of the optional features described.

Viewed from a third aspect, the present invention provides a method of locating a short-circuit isolator, the method comprising: detecting a wireless signal emitted by the short-circuit isolator; and determining a source of the wireless signal based on a strength of the wireless signal.

The short-circuit isolator may be as described above, optionally including any one or more or all of the optional features described.

BRIEF DESCRIPTION OF THE DRAWINGS

Certain preferred embodiments of the present disclosure will now be described in greater detail, by way of example only and with reference to the following figures, in which.

DETAILED DESCRIPTION

Figure 1:
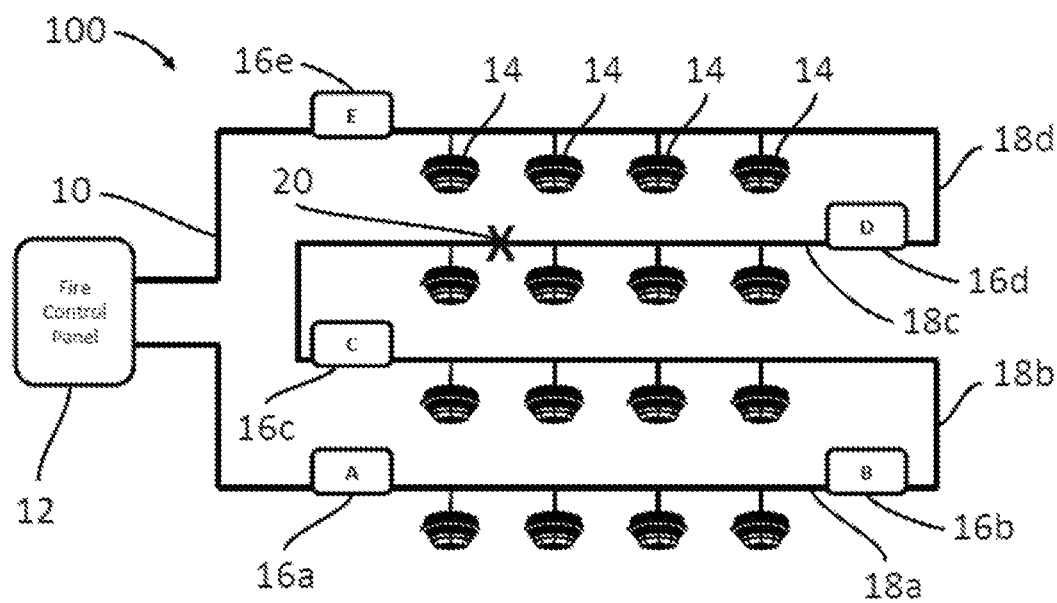
FIG. 1 shows a schematic diagram of part of a fire protection system comprising a plurality of fire detectors and a plurality of short-circuit isolators.

FIG. 1 is a schematic diagram illustrating power-transmission wiring 10 within a fire protection system 100.

The fire protection system 100 comprises a fire control panel 12 and a plurality of fire detectors 14, which in this example are illustrated as smoke sensors. The fire detectors 14 are electrically connected to the fire control panel 12 in a loop configuration, with the wiring 10 of the loop starting and finishing at the fire control panel 12.

The wiring 10 comprises a plurality of short-circuit isolators 16a-16e, which divide the wiring into a plurality of electrically-isolatable segments 18a-18d. In the event that a short circuit 20 occurs, for example due to an electrical fault, then the short-circuit isolators 16c, 16d on either side of the short circuit 20 will activate and electrically isolate the segment 18c containing the short circuit 20.

In one example, if a short circuit 20 were to occur at an exemplary location X, then short-circuit isolators C 16c and D 16d would isolate the segment 18c containing location X. The segments 18b, 18d on either side of the short circuit 20 (between isolators B 16b and C 16c, and between isolators D 16d and E 16e) will continue to receive power because the wiring 10 is configured as a loop, thereby preventing a single electrical fault from disabling the entire loop. For this reason, the number of electrical components permitted in a single electrically-isolatable segment 18 is normally restricted, for example to below 32 components.

Whilst the wiring 10 is shown in the illustrations as a single line, it will be appreciated that electrical wiring 10 typically comprises at least two conductors 22, 24, acting as a neutral conductor 22 and a live conductor 24, respectively. Optionally, an earth or ground conductor may be included.

Figure 2:
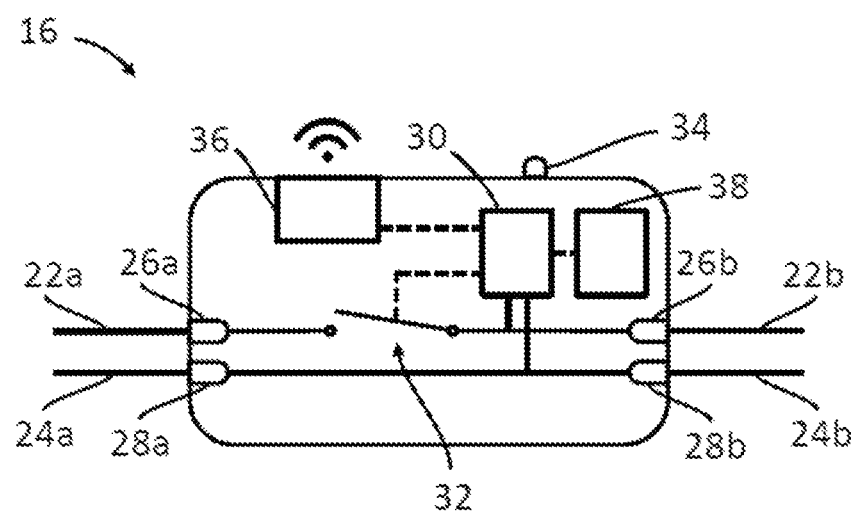
FIG. 2 shows a schematic diagram of the details of one of the short-circuit isolators of the fire protection system.

Referring now to FIG. 2, the conductors 22, 24 of adjacent wiring segments 18 are electrically connected via the respective short-circuit isolator 16. That is to say, the short-circuit isolator 16 comprises a first electrical terminal 26a for connection to a first neutral conductor 22a, a second electrical terminal 26b to a second neutral conductor 22b, a third electrical terminal 28a for connection to a first live conductor 24a and a fourth electrical conductor 28b for connection to a second live conductor 24b. The first live and neutral conductors 22a, 24b are associated with a segment 18 on one side of the short-circuit isolator 16, and the second live and neutral conductors 22b, 24b are associated with a segment 18 on the other side of the short-circuit isolator 16.

When the short-circuit isolator 16 is deactivated, electrical communication is permitted between the first and second electrical terminals 26a, 26b and between the third and fourth electrical terminals 28a, 28b.

The short-circuit isolator 16 comprises a controller 30 that is configured to detect a short circuit 20 by detecting a line resistance value of the wiring 10 dropping below a predetermined threshold. In response the controller 30 of the short-circuit isolator 16 will activate one or more switch 32 within the short-circuit isolator 16 and interrupt electrical communication along at least one the live or neutral conductors 22, 24 of the wiring 10, commonly only the neutral conductor 22, in order to prevent current from reaching the short circuit 20.

Thus, when the short-circuit isolator 20 is activated, electrical communication between the first and second electrical terminals 26a, 26b will be interrupted. However, typically, electrical communication between the third and fourth electrical terminals 28a, 28b is maintained.

Commonly, when activated, the short-circuit isolator 16 will activate a visible or audible indicator 34 to indicate the activated/interrupted status of the short-circuit isolator 16. The indicator 34 is usually formed integrally with the short-circuit indicator 16, and commonly takes the form of an LED 34. The short-circuit isolator 16 may additionally comprise further indicators (not shown) for showing other statuses of the short-circuit isolator 16.

After activation of the short-circuit isolator 16, the controller 30 may be configured to periodically test the wiring 10 to determine whether the short circuit 20 has been rectified, i.e. by determining that a line resistance has increased to above the threshold. This may be performed using current supplied from an adjacent segment 18 of the wiring 10, which has not been interrupted.

In accordance with the present disclosure, each short-circuit isolator 16 is provided with a wireless communications module 36. In one example, the wireless communications module 36 is configured to utilise Wi-Fi communications. However, any suitable wireless communications protocol may be used.

When enabled, the wireless communications module 36 may be configured to periodically transmit a signal for detection by an appropriate receiving tool 40. The wireless communications module 36 may in some embodiments be enabled only when the short-circuit isolator 16 has been activated, i.e. when it is isolating an adjacent segment 18 of wiring 10.

The wireless communications module 36 is preferably configured to transmit at least a signal indicating whether the short-circuit isolator 16 has identified a short circuit 20 and/or whether it has been activated to isolate an adjacent segment 18 of the wiring 10.

The short-circuit isolator 16 may comprise one or more instruments (not shown) capable of measuring the health of the short-circuit isolator 16 and/or the fire detection system 100 at the point where the short-circuit isolator 16 is located. For example, the instruments may monitor an operating current intensity and/or voltages on the wiring 10 where the short-circuit isolator 16 is located. Additionally, or alternatively, the instruments may monitor a line resistance of the wiring 10.

The instruments may communicate with the controller 30, which may in turn instruct the wireless communication module 36 to transmit health data indicative of the health of the short-circuit isolator 16 and/or the fire detection system 100 at the point where the short-circuit isolator 16 is located.

The health data may comprise raw data from the instruments, or the controller 30 may generate the health data by processing the raw data from the instruments in accordance with logic stored within the controller 30. For example, there may be an upper threshold current intensity (driven by the Control Panel) and/or a lower voltage threshold (permitted by the smoke detectors and other devices). The controller 30 may compare the data from the instruments against these thresholds and the health data may indicate whether the fire detection system 100 is operating within this limits at the short-circuit isolator 16.

Short-circuit isolators 16 are would typically be expected to be distributed regularly across the fire detection system 100, and so by monitoring these operational conditions with the short-circuit isolators it is possible to quickly identify various types of fault within the fire detection system 100.

The short-circuit isolator 16 may in some embodiments be provided with a memory 38 for storing log data. The memory 38 may be in communication with the controller 16, and the controller 16 may be configured to periodically store log data to the memory 38 indicating a status of the wiring 10. For example, the log data may comprise the health data discussed above.

In one embodiment, the short-circuit isolator 16 is configured to transmit at least a portion of the log data via the wireless communication module 36. For example, the log data may be transmitted responsive to a request received wirelessly via the wireless communication module 36. The portion of the log data may comprise log data stored following activation of the short-circuit isolator 16 and/or log data stored during a time period immediately preceding activation of the short-circuit isolator. The period may be a predetermined time period, for example set during manufacture or installation of the short-circuit isolator 16, or may be a requested time period, for example received wirelessly via the wireless communication module 36.

Whilst the controller 30, wireless communication module 36 and memory 38 are illustrated as separate components, one or more or all of these components may be integrated within a single unit.

Whilst it is advantageous to transmit the health data and/or log data wirelessly, it will be appreciated that the short-circuit isolator 16 may additionally or alternatively comprise a wired communication module (not shown), i.e. configured for transmission of data via a wired connection. For example, the wired communication module may comprise an Ethernet or USB interface. The short-circuit isolator 16 may be configured to transmit the health data and/or the log data via the wired communication module and/or to receive commands via the wired communication module.

Advantageously, the wireless communication module 36 may assist in locating a short-circuit isolator 16 that has been activated, even when the short-circuit isolator 16 is located in a location that is not immediately visible, such as behind a wall, in a floor cavity or above a false ceiling.

Figure 3:
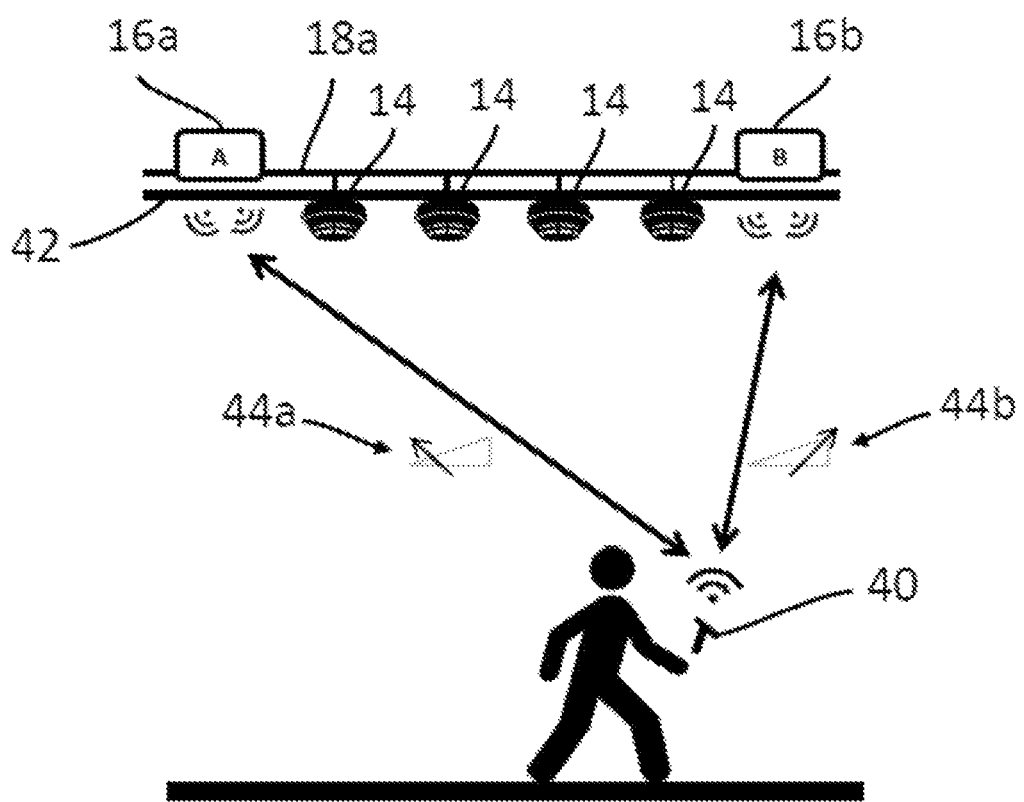
FIG. 3 shows an operator communicating with two of the short-circuit isolators of the fire protection system.

FIG. 3 illustrates a wiring segment 18a of the fire protection system 100 located between two short-circuit isolators 16a, 16b and including a plurality of fire detectors 14. The short-circuit isolators 16a, 16b are located above a false ceiling 42, with the fire detectors 16 being exposed from the false ceiling for detection of fire within the space below.

An operator is illustrated within the vicinity of the short-circuit isolators 16a, 16b and is provided with a tool 40 for detecting wireless communications from the short-circuit isolators 16a, 16b. The operator may know approximately where the short-circuit isolators 16a, 16b are located (for example, which floor of the building) based on the fire detectors 14 that have become unresponsive as a result of the electrical isolation of the corresponding wiring segment 18a caused by the short-circuit isolators 16a, 16b.

The tool 40 detects wireless communication transmitted by the wireless communication modules 36 of each of the activated short-circuit isolators 16a, 16b. The tool 40 can detect an intensity 44 of the wireless communication associated with each of the short-circuit isolators 16a, 16b. By moving the tool 40 with respect to a respective short-circuit isolator 16a, 16b, it is possible to determine a direction towards the short-circuit isolator 16a, 16b.

The tool 40 may display an intensity 44a, 44b of the wireless communication, in which case the direction to the short-circuit isolator 16a, 16b may be determined by the operator. For example, the tool 40 may display a list of short-circuit isolators 16a, 16b detected by the tool 40 and an intensity 44a, 44b of the respective wireless communication associated with each of the detected short-circuit isolators 16a, 16b. The intensity may be displayed numerically or graphically. Alternatively, or additionally, the tool 40 may determine the direction to the short circuit isolator 16a, 16b, which may be displayed visually to the operator, for example as an arrow indicating the direction.

The tool 40 may be capable of receiving and displaying a status of a short-circuit isolator 16a, 16b within the vicinity of the tool 40. For example, the tool 40 may display a list of short-circuit isolators 16a, 16b detected by the tool 40 and a status of each of the detected short-circuit isolators 16a, 16b.

The tool 40 may be capable of requesting and/or receiving health data and/or log data from a short-circuit isolator 16a, 16b within the vicinity of the tool 40. For example, the tool 40 may permit the user to display the health and/or log data for a particular short-circuit isolator 16a, 16b and/or to request new health and/or log data from the short-circuit isolator 16a, 16b. This data may be useful for identifying what has caused the short circuit 20 and/or locating the short circuit 20 within the wiring 10.

The tool 40 may be capable of wirelessly sending one or more command to a short-circuit isolator 16a, 16b and each short-circuit isolator 16a, 16b may be configured to respond to a command received via their wireless communication module 36. Exemplary commands may include: a command to test the line resistance; a command to return the most recent log data and/or health data; a command to reconnect the wiring segment 18, i.e. to deactivate the short-circuit isolator 16; or a command to isolate the wiring segment 18, i.e. to activate the short-circuit isolator 16. Isolating and re-connecting a wiring segment 18 in response to a command may also be advantageous for performing other work on the wiring 10.

In the illustrated embodiment, only fire detectors 14 are shown connected to the wiring loop. However, the wiring loop of the fire protection system 100 may additionally or alternatively include other components, such as one or more of a manual call point, a fire alarm, and a fire suppression system, such as a sprinkler, a fire barrier, a smoke extractor, etc.

It will be appreciated that only a single loop is shown in FIG. 1, but in practice the fire protection system 100 could comprise a plurality of separate loops. Furthermore, whilst the loop is shown as a single, continuous loop, in practice the loop may comprise one or more short spurs.

What is claimed is:

1. A fire protection system comprising:
a fire control panel; and
a plurality of components electrically connected to the fire control panel in a circuit having a loop configuration, wherein the components comprise one or more of a heat detector, a smoke detector, a fire alarm, and a manual call point;
wherein the circuit is divided into electrically-isolatable segments using at least one short-circuit isolator for electrically isolating a short circuit in the fire protection system, the short-circuit isolator comprising a wireless communications module.

2. The fire protection system according to claim 1, wherein the wireless communications module is configured to transmit a status indicative of whether the short-circuit isolator has been activated.

3. The fire protection system according to claim 1, wherein the short-circuit isolator is configured to operate in accordance with a command received via the wireless communications module.

4. The fire protection system according to claim 1, wherein the short-circuit isolator comprises a memory configured to store data relating to operation of the short-circuit isolator and/or health of the fire protection system at the short-circuit isolator.

5. The fire protection system according to claim 4, wherein the short-circuit isolator is configured to transmit at least part of the data from the memory via the wireless communications module.

6. The fire protection system to claim 1, wherein the short-circuit isolator is configured to interrupt an electrical circuit responsive to detection of a short circuit.

7. The fire protection system according to claim 6, wherein the short-circuit isolator is configured to detect a short circuit by detected of a reduction in line resistance within the circuit to below a threshold value.

8. A building comprising the fire protection system according to claim 1.

9. A method of interacting with a short-circuit isolator in the fire protection system according to claim 1, the method comprising wireless receiving data from the short-circuit isolator and/or wireless transmitting a command to the short-circuit isolator.

10. The method according to claim 9, wherein the data comprises a status indicative of whether the short-circuit isolator has been activated.

11. The method according to claim 9, wherein the data comprises one or more of:
data relating to the operation of the short-circuit isolator during a period prior to activation of the short-circuit isolator; and/or
data relating to the operation of the short-circuit isolator after activation of the short-circuit isolator; and/or
data relating to the health of the fire protection system at the short-circuit isolator.

12. The method according to claim 9, wherein the command comprises one of:
a command to test a line resistance at the short-circuit isolator;
a command to wirelessly transmit log data from the short-circuit isolator;
a command to electrically isolate two wiring segments adjacent the short-circuit isolator; and
a command to electrically connect two wiring segments adjacent the short-circuit isolator.

13. A method of locating a short-circuit isolator in the fire protection system according to claim 1, the method comprising:
detecting a wireless signal emitted by the short-circuit isolator; and
determining a source of the wireless signal based on a strength of the wireless signal.

14. A method of interacting with a short-circuit isolator, the method comprising wirelessly receiving data from the short-circuit isolator and/or wireless transmitting a command to the short-circuit isolator, wherein the data comprises one or more of:
data relating to the operation of the short-circuit isolator during a period prior to activation of the short-circuit isolator; and/or
data relating to the operation of the short-circuit isolator after activation of the short- circuit isolator; and/or
data relating to the health of the fire protection system at the short-circuit isolator.

15. A method of interacting with a short-circuit isolator, the method comprising wirelessly receiving data from the short-circuit isolator and/or wireless transmitting a command to the short-circuit isolator, wherein the command comprises one of:
a command to test a line resistance at the short-circuit isolator;
a command to wirelessly transmit log data from the short-circuit isolator;
a command to electrically isolate two wiring segments adjacent the short-circuit isolator; and
a command to electrically connect two wiring segments adjacent the short-circuit isolator.

* * * * *